US 8,527,858 B2

(12) United States Patent
Zhang et al.

(10) Patent No.: US 8,527,858 B2
(45) Date of Patent: Sep. 3, 2013

(54) SYSTEMS AND METHODS FOR SELECTIVE DECODE ALGORITHM MODIFICATION

(75) Inventors: Fan Zhang, Milpitas, CA (US); Weijun Tan, Longmont, CO (US); Zongwang Li, San Jose, CA (US); Shaohua Yang, San Jose, CA (US)

(73) Assignee: LSI Corporation, San Jose, CA (US)

( * ) Notice: Subject to any disclaimer, the term of this patent is extended or adjusted under 35 U.S.C. 154(b) by 31 days.

(21) Appl. No.: 13/284,767

(22) Filed: Oct. 28, 2011

(65) Prior Publication Data
US 2013/0111309 A1    May 2, 2013

(51) Int. Cl.
G06F 11/10    (2006.01)
H03M 13/00   (2006.01)

(52) U.S. Cl.
USPC ........................................... 714/807; 375/341

(58) Field of Classification Search
USPC ....................................... 714/807; 375/341
See application file for complete search history.

(56) References Cited

U.S. PATENT DOCUMENTS

| | | |
|---|---|---|
| 5,278,703 A | 1/1994 | Rub |
| 5,278,846 A | 1/1994 | Okayama et al. |
| 5,325,402 A | 6/1994 | Ushirokawa |
| 5,392,299 A | 2/1995 | Rhines et al. |
| 5,471,500 A | 11/1995 | Blaker et al. |
| 5,513,192 A | 4/1996 | Janku et al. |
| 5,523,903 A | 6/1996 | Hetzler |
| 5,550,870 A | 8/1996 | Blaker et al. |
| 5,612,964 A | 3/1997 | Haraszti |
| 5,701,314 A | 12/1997 | Armstrong et al. |
| 5,710,784 A | 1/1998 | Kindred et al. |
| 5,712,861 A | 1/1998 | Inoue et al. |
| 5,717,706 A | 2/1998 | Ikeda |
| 5,768,044 A | 6/1998 | Hetzler |
| 5,802,118 A | 9/1998 | Bliss et al. |
| 5,844,945 A | 12/1998 | Nam et al. |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | McCallister et al. |
| 6,023,783 A | 2/2000 | Divsalar et al. |

(Continued)

FOREIGN PATENT DOCUMENTS

| | | |
|---|---|---|
| EP | 0522578 | 1/1993 |
| EP | 0631277 | 12/1994 |

(Continued)

OTHER PUBLICATIONS

U.S. Appl. No. 11/461,026, filed Jul. 31, 2006, Tan, Weijun.

(Continued)

*Primary Examiner* — Sam Rizk
(74) *Attorney, Agent, or Firm* — Hamilton DeSanctis & Cha

(57) ABSTRACT

Various embodiments of the present invention provide systems and methods for data processing. For example, a data processing system is disclosed that includes a combination data decoder circuit. The combination data decoder circuit includes a first decoder circuit and a second decoder circuit. The first decoder circuit is operable to apply a first data decode algorithm to a decoder input to yield a decoded output. The second decoder circuit is operable to apply a second data decode algorithm to a subset of the decoded output to modify at least one element of the decoded output to yield a modified decoded output.

20 Claims, 4 Drawing Sheets

(56) References Cited

U.S. PATENT DOCUMENTS

| | | | |
|---|---|---|---|
| 6,029,264 A | 2/2000 | Kobayashi et al. | |
| 6,041,432 A | 3/2000 | Ikeda | |
| 6,065,149 A | 5/2000 | Yamanaka | |
| 6,097,764 A | 8/2000 | McCallister et al. | |
| 6,145,110 A | 11/2000 | Khayrallah | |
| 6,216,249 B1 | 4/2001 | Bliss et al. | |
| 6,216,251 B1 | 4/2001 | McGinn | |
| 6,229,467 B1 | 5/2001 | Eklund et al. | |
| 6,266,795 B1 | 7/2001 | Wei | |
| 6,317,472 B1 | 11/2001 | Choi et al. | |
| 6,351,832 B1 | 2/2002 | Wei | |
| 6,366,624 B1 * | 4/2002 | Balachandran et al. | 375/341 |
| 6,377,610 B1 | 4/2002 | Hagenauer et al. | |
| 6,381,726 B1 | 4/2002 | Weng | |
| 6,438,717 B1 | 8/2002 | Butler et al. | |
| 6,473,878 B1 | 10/2002 | Wei | |
| 6,476,989 B1 | 11/2002 | Chainer et al. | |
| 6,625,775 B1 | 9/2003 | Kim | |
| 6,657,803 B1 | 12/2003 | Ling et al. | |
| 6,671,404 B1 | 12/2003 | Kawatani et al. | |
| 6,748,034 B2 | 6/2004 | Hattori et al. | |
| 6,757,862 B1 | 6/2004 | Marianetti, II | |
| 6,785,863 B2 | 8/2004 | Blankenship et al. | |
| 6,788,654 B1 | 9/2004 | Hashimoto et al. | |
| 6,810,502 B2 | 10/2004 | Eidson | |
| 6,980,382 B2 | 12/2005 | Hirano et al. | |
| 6,986,098 B2 | 1/2006 | Poeppelman | |
| 7,010,051 B2 | 3/2006 | Murayama et al. | |
| 7,047,474 B2 | 5/2006 | Rhee et al. | |
| 7,058,873 B2 | 6/2006 | Song et al. | |
| 7,073,118 B2 | 7/2006 | Greenberg et al. | |
| 7,093,179 B2 | 8/2006 | Shea | |
| 7,113,356 B1 | 9/2006 | Wu | |
| 7,136,244 B1 | 11/2006 | Rothberg | |
| 7,173,783 B1 | 2/2007 | McEwen et al. | |
| 7,184,486 B1 | 2/2007 | Wu et al. | |
| 7,191,378 B2 | 3/2007 | Eroz et al. | |
| 7,203,015 B2 | 4/2007 | Sakai et al. | |
| 7,203,887 B2 | 4/2007 | Eroz et al. | |
| 7,236,757 B2 | 6/2007 | Raghaven et al. | |
| 7,257,764 B2 | 8/2007 | Suzuki et al. | |
| 7,310,768 B2 | 12/2007 | Eidson et al. | |
| 7,313,750 B1 | 12/2007 | Feng et al. | |
| 7,370,258 B2 | 5/2008 | Iancu et al. | |
| 7,403,752 B2 | 7/2008 | Raghaven et al. | |
| 7,430,256 B2 | 9/2008 | Zhidkov | |
| 7,502,189 B2 | 3/2009 | Sawaguchi et al. | |
| 7,505,537 B1 | 3/2009 | Sutardja | |
| 7,523,375 B2 | 4/2009 | Spencer | |
| 7,509,927 B2 | 9/2009 | Shin et el. | |
| 7,587,657 B2 | 9/2009 | Haratsch | |
| 7,590,168 B2 | 9/2009 | Raghavan et al. | |
| 7,702,989 B2 | 4/2010 | Graef et al. | |
| 7,712,008 B2 | 5/2010 | Song et al. | |
| 7,738,201 B2 | 6/2010 | Jin et al. | |
| 7,752,523 B1 | 7/2010 | Chaichanavong et al. | |
| 7,801,200 B2 | 9/2010 | Tan | |
| 7,802,163 B2 | 9/2010 | Tan | |
| 2003/0063405 A1 | 4/2003 | Jin et al. | |
| 2003/0081693 A1 | 5/2003 | Raghavan et al. | |
| 2003/0087634 A1 | 5/2003 | Raghavan et al. | |
| 2003/0112896 A1 | 6/2003 | Raghavan et al. | |
| 2003/0134607 A1 | 7/2003 | Raghavan et al. | |
| 2004/0071206 A1 | 4/2004 | Takatsu | |
| 2004/0098659 A1 | 5/2004 | Bjerke et al. | |
| 2005/0010855 A1 | 1/2005 | Lusky | |
| 2005/0078399 A1 | 4/2005 | Fung | |
| 2005/0111540 A1 | 5/2005 | Modrie et al. | |
| 2005/0157780 A1 | 7/2005 | Werner et al. | |
| 2005/0195749 A1 | 9/2005 | Elmasry et al. | |
| 2005/0216819 A1 | 9/2005 | Chugg et al. | |
| 2005/0273688 A1 | 12/2005 | Argon | |
| 2006/0020872 A1 | 1/2006 | Richardson et al. | |
| 2006/0031737 A1 | 2/2006 | Chugg et al. | |
| 2006/0123285 A1 | 6/2006 | De Araujo et al. | |
| 2006/0140311 A1 | 6/2006 | Ashley et al. | |
| 2006/0168493 A1 | 7/2006 | Song et al. | |
| 2006/0195772 A1 | 8/2006 | Graef et al. | |
| 2006/0210002 A1 | 9/2006 | Yang et al. | |
| 2006/0248435 A1 | 11/2006 | Haratsch | |
| 2006/0256670 A1 | 11/2006 | Park et al. | |
| 2007/0011569 A1 | 1/2007 | Vila Casado et al. | |
| 2007/0047121 A1 | 3/2007 | Eleftheriou et al. | |
| 2007/0047635 A1 | 3/2007 | Stojanovic et al. | |
| 2007/0110200 A1 | 5/2007 | Mergen et al. | |
| 2007/0230407 A1 | 10/2007 | Petrie et al. | |
| 2007/0286270 A1 | 12/2007 | Huang et al. | |
| 2008/0049825 A1 | 2/2008 | Chen et al. | |
| 2008/0055122 A1 | 3/2008 | Tan | |
| 2008/0065970 A1 | 3/2008 | Tan | |
| 2008/0069373 A1 | 3/2008 | Jiang et al. | |
| 2008/0168330 A1 | 7/2008 | Graef et al. | |
| 2008/0276156 A1 | 11/2008 | Gunnam | |
| 2008/0301521 A1 | 12/2008 | Gunnam | |
| 2009/0185643 A1 | 7/2009 | Fitzpatrick | |
| 2009/0199071 A1 | 8/2009 | Graef | |
| 2009/0235116 A1 | 9/2009 | Tan et al. | |
| 2009/0235146 A1 | 9/2009 | Tan et al. | |
| 2009/0259915 A1 | 10/2009 | Livshitz et al. | |
| 2009/0273492 A1 | 11/2009 | Yang et al. | |
| 2009/0274247 A1 | 11/2009 | Galbraith et al. | |
| 2010/0002795 A1 | 1/2010 | Raghaven et al. | |
| 2010/0042877 A1 | 2/2010 | Tan | |
| 2010/0042890 A1 | 2/2010 | Gunnam | |
| 2010/0050043 A1 | 2/2010 | Savin | |
| 2010/0061492 A1 | 3/2010 | Noeldner | |
| 2010/0070837 A1 | 3/2010 | Xu et al. | |
| 2010/0164764 A1 | 7/2010 | Nayak | |
| 2010/0185914 A1 | 7/2010 | Tan et al. | |
| 2011/0075569 A1 | 3/2011 | Marrow et al. | |
| 2011/0080211 A1 | 4/2011 | Yang et al. | |
| 2011/0167246 A1 | 7/2011 | Yang et al. | |

FOREIGN PATENT DOCUMENTS

| | | |
|---|---|---|
| EP | 1814108 | 8/2007 |
| WO | WO 2006/016751 | 2/2006 |
| WO | WO 2006/134527 | 12/2006 |
| WO | WO 2007/091797 | 8/2007 |
| WO | WO 2010/126482 | 4/2010 |
| WO | 2010/101578 | 9/2010 |
| WO | WO 2010/101578 | 9/2010 |

OTHER PUBLICATIONS

U.S. Appl. No. 11/461,198, filed Jul. 31, 2006, Tan, Weijun.
U.S. Appl. No. 11/461,283, filed Jul. 31, 2006, Tan, Weijun.
U.S. Appl. No. 12/540,283, filed Aug. 12, 2009, Liu, et al.
U.S. Appl. No. 12/652,201, filed Jan. 5, 2010, Mathew, et al.
U.S. Appl. No. 12/763,050, filed Apr. 19, 2010, Ivkovic, et al.
U.S. Appl. No. 12/792,555, filed Jun. 2, 2010, Liu, et al.
U.S. Appl. No. 12/887,317, filed Sep. 21, 2010, Xia, et al.
U.S. Appl. No. 12/887,330, filed Sep. 21, 2010, Zhang, et al.
U.S. Appl. No. 12/887,369, filed Sep. 21, 2010, Liu, et al.
U.S. Appl. No. 12/901,816, filed Oct. 11, 2010, Li, et al.
U.S. Appl. No. 12/901,742, filed Oct. 11, 2010, Yang.
U.S. Appl. No. 12/917,756, filed Nov. 2, 2010, Miladinovic, et al.
U.S. Appl. No. 12/947,931, filed Nov. 17, 2010, Yang, Shaohua.
U.S. Appl. No. 12/947,947, filed Nov. 17, 2010, Ivkovic, et al.
U.S. Appl. No. 12/972,942, filed Dec. 20, 2010, Liao, et al.
U.S. Appl. No. 12/992,948, filed Nov. 16, 2010, Yang, et al.
U.S. Appl. No. 13/021,814, filed Feb. 7, 2011, Jin, Ming, et al.
U.S. Appl. No. 13/031,818, filed Feb. 22, 2011, Xu, Changyou, et al.
U.S. Appl. No. 13/050,129, filed Mar. 17, 2011, Tan, et al.
U.S. Appl. No. 13/050,765, filed Mar. 17, 2011, Yang, et al.
U.S. Appl. No. 13/088,119, filed Apr. 15, 2011, Zhang, et al.
U.S. Appl. No. 13/088,146, filed Apr. 15, 2011, Li, et al.
U.S. Appl. No. 13/088,178, filed Apr. 15, 2011, Sun, et al.
U.S. Appl. No. 13/126,748, filed Apr. 28, 2011, Tan.
U.S. Appl. No. 13/167,764, filed Jun. 24, 2011, Li, Zongwang, et al.
U.S. Appl. No. 13/167,771, filed Jun. 24, 2011, Li, Zongwang, et al.
U.S. Appl. No. 13/167,775, filed Jun. 24, 2011, Li, Zongwang.
U.S. Appl. No. 13/186,146, filed Jul. 19, 2011, Mathew, et al.

U.S. Appl. No. 13/186,213, filed Jul. 19, 2011, Mathew, et al.
U.S. Appl. No. 13/186,234, filed Jul. 19, 2011, Xia, Haitao, et al.
U.S. Appl. No. 13/186,251, filed Jul. 19, 2011, Xia, Haitao, et al.
U.S. Appl. No. 13/186,174, filed Jul. 19, 2011, Mathew, et al.
U.S. Appl. No. 13/186,197, filed Jul. 19, 2011, Mathew, George et al.
U.S. Appl. No. 13/213,751, filed Aug. 19, 2011, Zhang, Fan, et al.
U.S. Appl. No. 13/213,808, filed Aug. 19, 2011, Jin, Ming.
U.S. Appl. No. 13/220,142, filed Aug. 29, 2011, Chang, Wu, et al.
U.S. Appl. No. 13/227,538, filed Sep. 8, 2011, Yang, Shaohua, et al.
U.S. Appl. No. 13/227,544, filed Sep. 8, 2011, Yang, Shaohua, et al.
U.S. Appl. No. 13/239,683, filed Sep. 22, 2011, Xu, Changyou.
U.S. Appl. No. 13/239,719, filed Sep. 22, 2011, Xia, Haitao, et al.
U.S. Appl. No. 13/251,342, filed Oct. 2, 2011, Xia, Haitao, et al.
U.S. Appl. No. 13/269,832, filed Oct. 10, 2011, Xia, Haitao, et al.
U.S. Appl. No. 13/269,852, filed Oct. 10, 2011, Xia, Haitao, et al.
U.S. Appl. No. 13/284,819, filed Oct. 28, 2011, Tan, Weijun, et al.
U.S. Appl. No. 13/284,730, filed Oct. 28, 2011, Zhang, Fan, et al.
U.S. Appl. No. 13/284,754, filed Oct. 28, 2011, Zhang, Fan, et al.
U.S. Appl. No. 13/284,767, filed Oct. 28, 2011, Zhang, Fan, et al.
U.S. Appl. No. 13/284,826, filed Oct. 28, 2011, Tan, Weijun, et al.
U.S. Appl. No. 13/295,150, filed Nov. 14, 2011, Li, Zongwang, et al.
U.S. Appl. No. 13/295,160, filed Nov. 14, 2011, Li, Zongwang, et al.
U.S. Appl. No. 13/251,340, filed Oct. 3, 2011, Xia, Haitao, et al.
Amer et al "Design Issues for a Shingled Write Disk System" MSST IEEE 26th Symposium May 2010.
Bahl, et al "Optimal decoding of linear codes for Minimizing symbol error rate", IEEE Trans. Inform. Theory, vol. 20, pp. 284-287, Mar. 1974.
Casado et al., Multiple-rate low-denstiy parity-check codes with constant blocklength, IEEE Transations on communications, Jan. 2009, vol. 57, pp. 75-83.
Collins and Hizlan, "Determinate State Convolutional Codes" IEEE Transactions on Communications, Dec. 1993.
Eleftheriou, E. et al., "Low Density Parity-Check Codes for Digital Subscriber Lines", Proc ICC 2002, pp. 1752-1757.
Fisher, R et al., "Adaptive Thresholding"[online] 2003 [retrieved on May 28, 2010] Retrieved from the Internet <URL:http://homepages.inf.ed.ac.uk/rbf/HIPR2/adpthrsh.htm.
Fossnorier, Marc P.C. "Quasi-Cyclic Low-Density Parity-Check Codes From Circulant Permutation Maricies" IEEE Transactions on Information Theory, vol. 50, No. 8 Aug. 8, 2004.
Gibson et al "Directions for Shingled-Write and Two-Dimensional Magnetic Recording System" Architectures: Synergies with Solid-State Disks Carnegie Mellon Univ. May 1, 2009.
K. Gunnam et al., "Next Generation iterative LDPC solutions for magnetic recording storage", invited paper. The Asilomar Conference on Signals, Systems, and Computers, Nov. 2008.
K. Gunnam et al., "Value-Reuse Properties of Min-Sum for GF(q)" (dated Oct. 2006) Dept. of ECE, Texas A&M University Technical Note, published about Aug. 2010.
K. Gunnam et al., "Value-Reuse Properties of Min-Sum for GF(q)"(dated Jul. 2008) Dept. of ECE, Texas A&M University Technical Note, published about Aug. 2010.
K. Gunnam "Area and Energy Efficient VLSI Architectures for Low-Density Parity-Check Decoders Using an On-The-Fly Computation" dissertation at Texas A&M University, Dec. 2006.
Han and Ryan, "Pinning Techniques for Low-Floor Detection/Decoding of LDPC-Coded Partial Response Channels", 5th International Symposium on Turbo Codes &Related Topics, 2008.
Hagenauer, J. et al A Viterbi Algorithm with Soft-Decision Outputs and its Applications in Proc. IEEE Globecom, pp. 47. 11-47 Dallas, TX Nov. 1989.
Lee et al., "Partial Zero-Forcing Adaptive MMSE Receiver for DS-CDMA Uplink in Multicell Environments" IEEE Transactions on Vehicular Tech. vol. 51, No. 5, Sep. 2002.
Lin et al "An efficient VLSI Architecture for non binary LDPC decoders"—IEEE Transaction on Circuits and Systems II vol. 57, Issue 1 (Jan. 2010) pp. 51-55.

Mohsenin et al., "Split Row: A Reduced Complexity, High Throughput LDPC Decoder Architecture", pp. 1-6, printed from www.ece.ucdavis.edu on Jul. 9, 2007.
Moon et al, "Pattern-dependent noise prediction in signal-dependent Noise," IEEE JSAC, vol. 19, No. 4 pp. 730-743, Apr. 2001.
Perisa et al "Frequency Offset Estimation Based on Phase Offsets Between Sample Correlations" Dept. of Info. Tech. University of Ulm 2005.
Sari H et al., "Transmission Techniques for Digital Terrestrial TV Broadcasting" IEEE Communications Magazine, IEEE Service Center NY, NY vol. 33, No. 2 Feb. 1995.
Selvarathinam, A.: "Low Density Parity-Check Decoder Architecture for High Throughput Optical Fiber Channels" IEEE International Conference on Computer Design (ICCD '03) 2003.
Shu Lin, Ryan, "Channel Codes, Classical and Modern" 2009, Cambridge University Press, pp. 213-222.
Unknown, "Auto threshold and Auto Local Threshold" [online] [retrieved May 28, 2010] Retrieved from the Internet: <URL:http://www.dentristy.bham.ac.uk/landinig/software/autoth.
Vasic, B., "High-Rate Low-Density Parity-Check Codes Based on Anti-Pasch Affine Geometries," Proc ICC 2002, pp. 1332-1336.
Vasic, B., "High-Rate Girth-Eight Codes on Rectangular Integer Lattices", IEEE Trans. Communications, vol. 52, Aug. 2004, pp. 1248-1252.
Wang Y et al., "A Soft Decision Decoding Scheme for Wireless COFDM With Application to DVB-T" IEEE Trans. on Consumer elec., IEEE Service Center, NY,NY vo. 50, No. 1 Feb. 2004.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Xia et al, "A Chase-GMD algorithm of Reed-Solomon codes on perpendicular channels", IEEE Transactions on Magnetics, vol. 42 pp. 2603-2605, Oct. 2006.
Xia et al, "Reliability-based Reed-Solomon decoding for magnetic recording channels", IEEE International Conference on Communication pp. 1977-1981, May 2008.
Yeo et al., "VLSI Architecture for Iterative Decoders in Magnetic Storage Channels", Mar. 2001, pp. 748-755, IEEE trans. Magnetics, vol. 37, No. 2.
Youn, et al. "BER Perform. Due to Irrreg. of Row-Weight Distrib. of the Parity-Chk. Matirx in Irreg. LDPC Codes for 10-Gb/s Opt. Signls" Jrnl of Lightwave Tech., vol. 23, Sep. 2005.
Zhong et al., "Area-Efficient Min-Sum Decoder VLSI Architecture for High-Rate QC-LDPC Codes in Magnetic Recording", pp. 1-15, Submitted 2006, not yet published.
Zhong, "Block-LDPC: A Practical LDPC Coding System Design Approach", IEEE Trans. on Circuits, Regular Papers, vol. 5, No. 4, pp. 766-775, Apr. 2005.
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Iterative MAX-LOG-MAP and LDPC Detector/Decoder Hardware Implementation for Magnetic Read Channel", SRC TECHRON, pp. 1-4, Oct. 2005.
Zhong et al., "Joint Code-Encoder Design for LDPC Coding System VLSI Implementation", ISCAS, IEEE pp. 389-392, May 2004.
Zhong et al., "Quasi Cyclic Ldpc Codes for the Magnetic Recording Channel: Code Design and VSLI Implementation", IEEE Transactions on Magnetics, v. 43, pp. 1118-1123, Mar. 2007.
Zhong, "VLSI Architecture of LDPC Based Signal Detection and Coding System for Magnetic Recording Channel", Thesis, RPI, Troy, NY, pp. 1-95, May 2006.

* cited by examiner

SYSTEMS AND METHODS FOR SELECTIVE DECODE ALGORITHM MODIFICATION

BACKGROUND OF THE INVENTION

The present inventions are related to systems and methods for data processing, and more particularly to systems and methods for data decoding.

Various storage systems include data processing circuitry implemented with a data decoding circuit. In some cases, a belief propagation based decoder circuit is used. In such cases where high rate low density parity check codes are used, an error floor is more severe because short cycles are unavoidable. Such short cycles make the messages in the belief propagation decoder correlate quickly and degrade the performance. In contrast, a maximum likelihood decoder may be used as it does not exhibit the same limitations. However, such maximum likelihood decoders are typically too complex for practical implementation.

Hence, for at least the aforementioned reasons, there exists a need in the art for advanced systems and methods for data processing.

BRIEF SUMMARY OF THE INVENTION

The present inventions are related to systems and methods for data processing, and more particularly to systems and methods for data decoding.

Various embodiments of the present invention provide data processing systems. Such systems include a combination data decoder circuit. The combination data decoder circuit includes a first decoder circuit and a second decoder circuit. The first decoder circuit is operable to apply a first data decode algorithm to a decoder input to yield a decoded output. The second decoder circuit is operable to apply a second data decode algorithm to a subset of the decoded output to modify at least one element of the decoded output to yield a modified decoded output. In some cases, the data processing system further includes a data detector circuit that is operable to apply a data detection algorithm to a data set to yield a detected output. In such cases, the decoder input is derived from the detected output. The data detection algorithm may be, but is not limited to, a maximum a posteriori data detection algorithm or a Viterbi detection algorithm. In some cases, the data processing system is implemented as part of a storage device or a receiving device. In one or more cases, the data processing system is implemented as part of an integrated circuit.

In some instances of the aforementioned embodiments, the decoded output is a first decoded output. In such instances, the first decoder output is operable to apply the first data decode algorithm to the decoder input guided by the modified decoded output to yield a second decoded output. In various instances of the aforementioned embodiments, the first data decode algorithm is a belief propagation data decode algorithm, and the second data decode algorithm is a maximum likelihood data decode algorithm.

In various instances of the aforementioned embodiments, the combination data decoder circuit further includes a controller circuit operable to selectively control generation of the modified decoded output. In some such instances, the controller circuit enables generation of the modified decoded output when: a number of iterations of the first decoder circuit applying the first data decode algorithm to a decoder input is greater than a first threshold value; a number of unsatisfied checks corresponding to the decoded output is less than a second threshold value; and the unsatisfied checks corresponding to the decoded output is the same as the unsatisfied checks corresponding to a previous decoded output. In one particular case, the first threshold value is three, and the second threshold value is ten.

Other embodiments of the present invention provide methods for data processing. The methods include: applying a first data decode algorithm to a decoder input to yield a first decoded output; applying a second data decode algorithm to a subset of the first decoded output to modify at least one element of the decoded output to yield a modified decoded output; and applying the first data decode algorithm to the decoder input guided by the modified decoded output to yield a second decoded output. In some cases, the methods further include applying a data detection algorithm to a data set to yield a detected output, wherein the decoder input is derived from the detected output. In particular cases, the methods further include: receiving an analog input; converting the analog input to a series of digital samples; and equalizing the series of digital samples to yield the data set. The data detection algorithm may be, but is not limited to, a maximum a posteriori data detection algorithm or a Viterbi detection algorithm. In some cases, the first data decode algorithm is a belief propagation data decode algorithm, and the second data decode algorithm is a maximum likelihood data decode algorithm. In some instances of the aforementioned embodiments, the methods further include determining that there are at least one failed checksum associated with the first decoded output. In such instances, the subset of the first decoded output includes elements of the first decoded output that correspond to the at least one failed checksum. In some cases, the methods further include determining that the same at least one failed checksum occurs for at least two consecutive applications of the first data decode algorithm to the decoder input.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for data processing, and more particularly to systems and methods for data decoding.

Various embodiments of the present invention provide data processing systems that include a data decoder circuit that includes a low complexity decoder circuit and a partial maximum likelihood parity check decoder circuit that is selectively used to modify an output of the low complexity decoder circuit when a possible trapping set is detected. As just one of many advantages, the aforementioned approach allows for using data decoder circuits that exhibit relatively low complexity such as, for example, a belief propagation decoder circuit, while using another decoder algorithm to correct errors that are not correctable by the low complexity decoder algorithm. As the errors to be corrected are localized by the belief propagation decoder circuit, the complexity of the combination of the partial maximum likelihood parity check decoder circuit and the belief propagation decoder circuit is substantially less than that of a maximum likelihood decoder circuit.

Figure 1A:
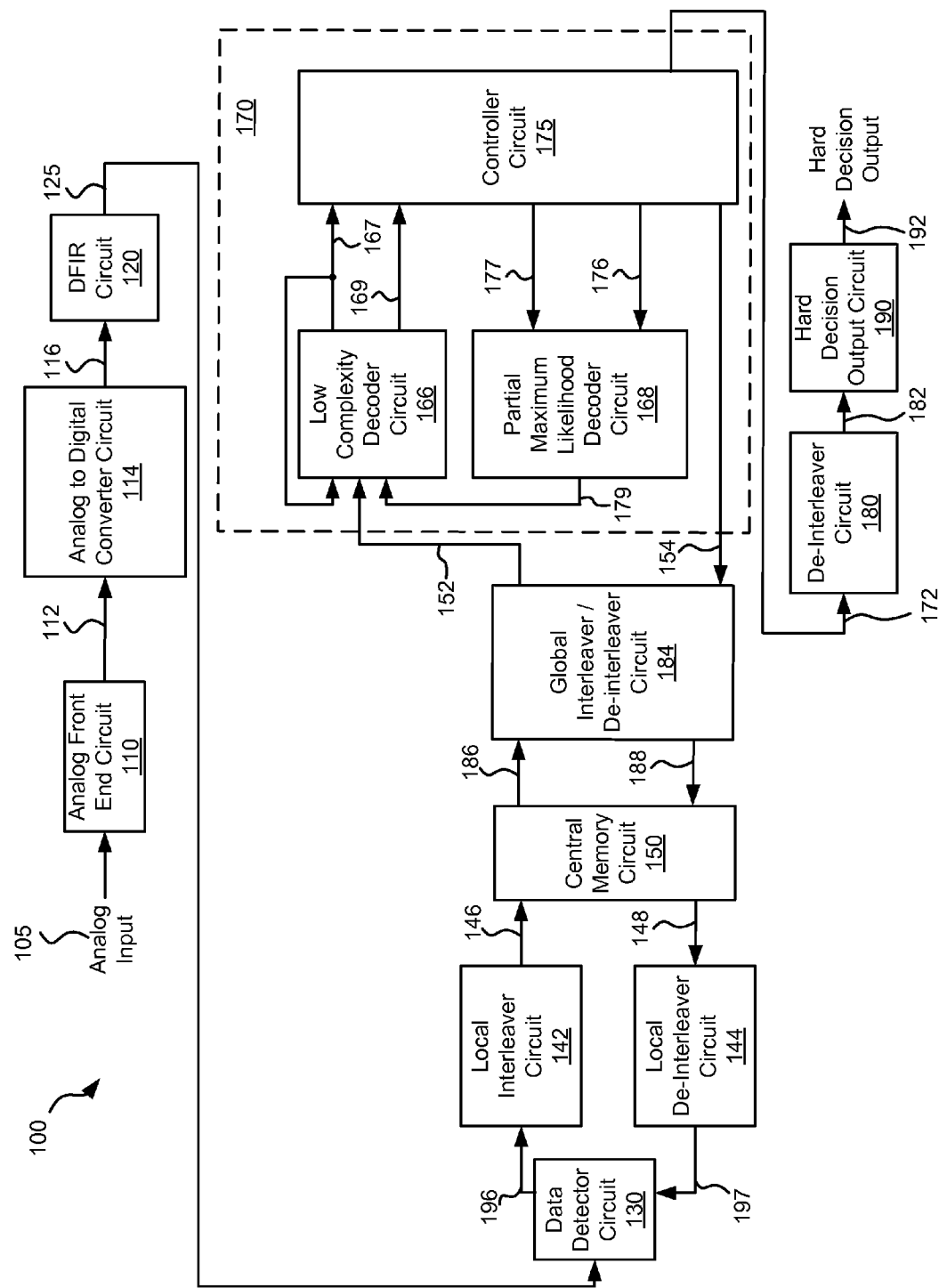
FIG. 1a shows a data processing circuit including a combination data decoder circuit including a combination of a low complexity decoder circuit and a partial maximum likelihood decoder circuit in accordance with one or more embodiments of the present invention.

Turning to FIG. 1a, a data processing circuit 100 is shown that includes a combination data decoder circuit 170 including a combination of a low complexity decoder circuit 166 and a partial maximum likelihood decoder circuit 168 in accordance with one or more embodiments of the present invention. Data processing circuit 100 includes an analog front end circuit 110 that receives an analog signal 105. Analog front end circuit 110 processes analog signal 105 and provides a processed analog signal 112 to an analog to digital converter circuit 114. Analog front end circuit 110 may include, but is not limited to, an analog filter and an amplifier circuit as are known in the art. Based upon the disclosure provided herein, one of ordinary skill in the art will recognize a variety of circuitry that may be included as part of analog front end circuit 110. In some cases, analog signal 105 is derived from a read/write head assembly (not shown) that is disposed in relation to a storage medium (not shown). In other cases, analog signal 105 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 105 may be derived.

Analog to digital converter circuit 114 converts processed analog signal 112 into a corresponding series of digital samples 116. Analog to digital converter circuit 114 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 116 are provided to an equalizer circuit 120. Equalizer circuit 120 applies an equalization algorithm to digital samples 116 to yield an equalized output 125. In some embodiments of the present invention, equalizer circuit 120 is a digital finite impulse response filter circuit as are known in the art. In some cases, equalizer circuit 120 includes sufficient memory to maintain one or more codewords until a data detector circuit 130 is available for processing, and for multiple processes through data detector circuit 130.

Data detector circuit 130 is operable to apply a data detection algorithm to a received codeword or data set, and in some cases data detector circuit 130 can process two or more codewords in parallel. In some embodiments of the present invention, data detector circuit 130 is a Viterbi algorithm data detector circuit as are known in the art. In other embodiments of the present invention, data detector circuit 130 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. Data detector circuit 130 is started based upon availability of a data set from equalizer circuit 120 or from a central memory circuit 150.

Upon completion, data detector circuit 130 provides a detector output 196. Detector output 196 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detected output 196 is provided to a local interleaver circuit 142. Local interleaver circuit 142 is operable to shuffle sub-portions (i.e., local chunks) of the data set included as detected output and provides an interleaved codeword 146 that is stored to central memory circuit 150. Interleaver circuit 142 may be any circuit known in the art that is capable of shuffling data sets to yield a re-arranged data set. Interleaved codeword 146 is stored to central memory circuit 150. Interleaved codeword 146 is comprised of a number of encoded sub-codewords designed to reduce the complexity of a downstream data decoder circuit while maintaining reasonable processing ability.

Once a data decoding circuit 170 is available, a previously stored interleaved codeword 146 is accessed from central memory circuit 150 as a stored codeword 186 and globally interleaved by a global interleaver/de-interleaver circuit 184. Global interleaver/De-interleaver circuit 184 may be any circuit known in the art that is capable of globally rearranging codewords. Global interleaver/De-interleaver circuit 184 provides a decoder input 152 input to low data decoder circuit 170.

Data decoder circuit 170 includes low complexity decoder circuit 166, partial maximum likelihood decoder circuit 168, and a controller circuit 175. Low complexity decoder circuit 166 may be any decoder circuit known in the art that is less complex to implement than a maximum likelihood decoder circuit. In some embodiments of the present invention, low complexity decoder circuit 166 is a belief propagation data decoder circuit as are known in the art. Such a belief propagation data decoder circuit may be implemented similar to that discussed in Pearl, Judea, "REVEREND BAYES ON INFERENCE ENGINES: A DISTRIBUTED HIERAR- CHAL APPROACH", AAAI-82 Proceedings, 1982. The entirety of the aforementioned reference is incorporated herein by reference for all purposes Low complexity decoder circuit 166 receives decoder input 152 and applies a decoder algorithm thereto to yield a decoder output 167. In addition, checksum indices 169 (i.e., an identification of a particular parity check equation) of any unsatisfied parity checks are generated. Decoder output 167 and checksum indices 169 are provided to controller circuit 175. In addition, decoder output 167 is fed back to low complexity decoder circuit 166 where it can be used to guide subsequent application of the decoder algorithm to decoder input 152.

Controller circuit 175 utilizes decoder output 167 and checksum indices 169 to determine if a potential trapping set condition has occurred. Where a potential trapping set condition has occurred, an LLR subset output 177 (a portion of decoder output 167) and corresponding index outputs 176 (i.e., a portion of checksum indices 169 corresponding to LLR subset output 177) are provided by controller circuit 175 to partial maximum likelihood decoder circuit 168. Partial maximum likelihood decoder circuit 168 applies a maximum likelihood decoder algorithm to LLR subset output 177 in an effort to correct any remaining unsatisfied checks. This involves building a trellis for a local portion of the decoded output and to perform trellis based maximum likelihood decoding on the local portion of the decoded output. The following equations describe the operation of partial maximum likelihood decoder circuit 168 to generate a given soft output, $L(b_i)$:

$$L(b_i) = \ln\left[\frac{\sum b \in b_i^0 \, p(b)p(L|b)}{\sum b \in b_i^1 \, p(b)p(L|b)}\right],$$

where b represents a bit of decoded output 167, p(b) represents the a priori probability that the entire vector of the correct hard decision b is correct, and p(L|b) is the conditional probability given vector b that $b_i$ is a logic '1' (indicated by $b_i^1$) or a logic '0' (indicated by $b_i^0$). The aforementioned equation may be simplified as follows:

$$L(b_i) = \ln\left[\frac{\sum \max_{b \in b_i^0} p(b)p(L|b)}{\sum \max_{b \in b_i^1} p(b)p(L|b)}\right];$$

$$L(b_i) = \ln\left[\frac{\sum p(L|\hat{b}^0)}{\sum p(L|\hat{b}^1)}\right]; \text{ and}$$

$$L(b_i) = \sum_{j=0}^{N-1} \left[|l_i|\left((-1)^{sign(1-2\hat{b}^0)sign(l_i)} - (-1)^{sign(1-2\hat{b}^1)sign(l_i)}\right)\right],$$

where $l_i$ is the soft data (i.e., LLR data) associated with $b_j$. Accordingly, the probability for a given hard decision value $b_i$ may be approximated by the following equation:

$$p[L|b_i] \propto \sum_{j=0}^{N-1} \left((-1)^{sign(1-2\hat{b}_i)sign(l_i)}\right)|l_i|.$$

As LLR subset output 177 is localized, the complexity of partial maximum likelihood decoder circuit 168 is substantially less than the complexity of implementing a corresponding maximum likelihood decoder circuit capable of handing an entire codeword. Where a remaining unsatisfied check is corrected by partial maximum likelihood decoder circuit 168, the corresponding elements of LLR subset output 177 are modified to corrected values 179 that are fed back to low complexity decoder circuit 166 where they are used in place of the corresponding element of decoder output 167 to guide subsequent application of the decoder algorithm to decoder input 152. In some cases, partial maximum likelihood decoder circuit 168 is implemented using the maximum likelihood decoder approach disclosed in Viterbi, Andrew J., "ERROR BOUNDS FOR CONVOLUTION CODES AND AN ASYMPTITICALLY OPTIMUM DECODING ALGORITHM", IEEE Transactions on Information Theory, Vol. IT-13, No. 2, April 1967. The entirety of the aforementioned reference is incorporated herein by reference for all purposes. Where a potential trapping set condition has not been identified and one or more additional local iterations remain, low complexity decoder circuit 166 is triggered to re-apply the decoder algorithm to decoder input 152 guided by decoder output 167.

In one particular embodiment of the present invention, a potential trapping set condition is considered to have occurred where the number of remaining unsatisfied checks after application of the decoder algorithm to decoder input 152 is less than ten, and the indexes corresponding to the remaining unsatisfied checks have not changed for at least two local iterations (i.e., passes through low complexity decoder circuit 166). In addition, in some cases, controller circuit 175 is not enabled to indicate a potential trapping set condition until at least four local iterations of decoder algorithm to decoder input 152 have completed. Based upon the disclosure provided herein, one of ordinary skill in the art will recognize other indicia that may be used to define the occurrence of a potential trapping set condition and/or to trigger operation of partial maximum likelihood decoder circuit 168.

In addition, controller circuit 175 determines whether the data decoding algorithm converged. Where the data decoding algorithm failed to converge and no more local iterations (iterations through low complexity decoder circuit 166), controller circuit 175 provides a decoder output 154 (i.e., decoder output 167) back to central memory circuit 150 via global interleaver/de-interleaver circuit 184. Prior to storage of decoded output 154 to central memory circuit 150, decoded output 154 is globally de-interleaved to yield a globally de-interleaved output 188 that is stored to central memory circuit 150. The global de-interleaving reverses the global interleaving earlier applied to stored codeword 186 to yield decoder input 152. Once data detector circuit 130 is available, a previously stored de-interleaved output 188 is accessed from central memory circuit 150 and locally de-interleaved by a de-interleaver circuit 144. De-interleaver circuit 144 re-arranges decoder output 148 to reverse the shuffling originally performed by interleaver circuit 142. A resulting de-interleaved output 197 is provided to data detector circuit 130 where it is used to guide subsequent detection of a corresponding data set receive as equalized output 125.

Alternatively, where the data decoding algorithm converged, controller circuit 175 provides an output codeword 172 to a de-interleaver circuit 180. De-interleaver circuit 180 rearranges the data to reverse both the global and local interleaving applied to the data to yield a de-interleaved output 182. De-interleaved output 182 is provided to a hard decision output circuit 190. Hard decision output circuit 190 is operable to re-order data sets that may complete out of order back into their original order. The originally ordered data sets are then provided as a hard decision output 192.

An example of operation of controller circuit 175 is provided in the following pseudo-code:

```
If (number of unsatisfied checks == 0)
{
    provide decoder output 167 as output codeword 172
}
Else if (number of unsatisfied checks > 0 && number of local
iterations == maximum)
{
    provide decoder output 167 as decoded output 154
}
Else if (number of unsatisfied checks > 0 &&
    [number of unsatisfied checks >= M OR
        number of local iterations is < N OR
        indexes 169 change from one local iteration to the next])
{
    provide decoder output 167 as an input to low complexity decoder
    circuit 166
}
Else if (number of unsatisfied checks > 0 &&
    [number of unsatisfied checks < M AND
        number of local iterations is >= N OR
        indexes 169 do not change from one local iteration to the next])
{
    provide LLR subset output 177 to partial maximum likelihood decoder
    circuit 168
}
```

Figure 1B:
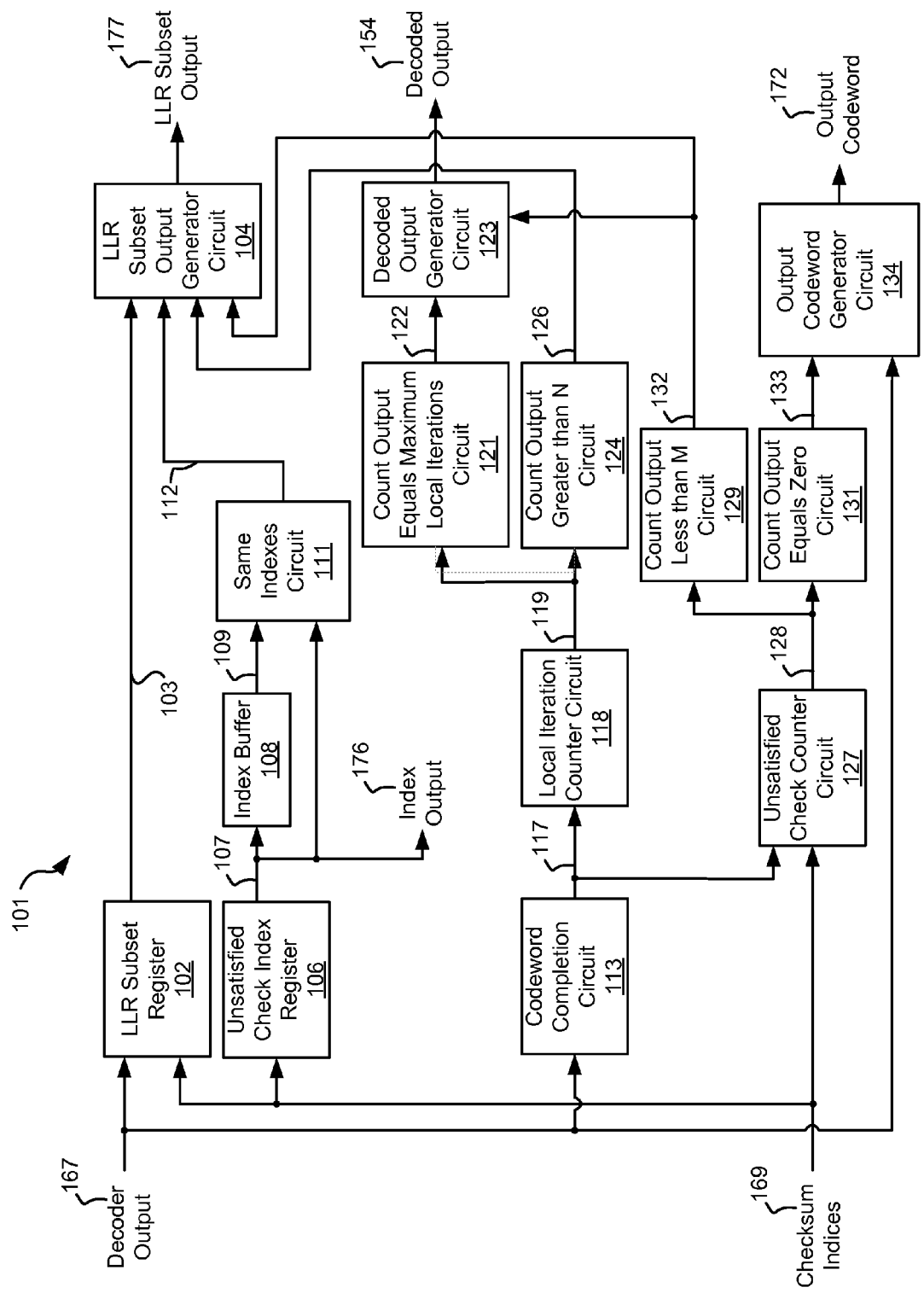
FIG. 1b depicts a controller circuit that may be used in relation to the combination decoder circuit of FIG. 1 in accordance with various embodiments of the present invention.

Turning to FIG. 1*b*, a controller circuit 101 that may be used in place of controller circuit 175 of FIG. 1 in accordance with various embodiments of the present invention. Controller circuit 101 includes an LLR subset register 102 that stores each element of decoder output 167 that corresponds to a non-zero value of a checksum identified as one of checksum indices 169. An LLR subset register output 103 is provided by LLR subset register 102. In addition, controller circuit 101 includes an unsatisfied check index register 106 that stores each index for which one or more instances of decoder output 167 stored to LLR subset register 102. Controller circuit 101 also includes a codeword completion circuit 113 that counts decoder outputs 167 to determine whether all instances of a codeword have been received. Where a completed codeword is received, a codeword complete output 117 is asserted high.

An unsatisfied check counter circuit 127 counts the number of non-zero unsatisfied checks indicated by checksum indices to yield an unsatisfied check count value 128. Unsatisfied check counter circuit 127 is reset whenever codeword complete output 117 is asserted such that a completed codeword is indicated. Hence, unsatisfied check count value 128 indicates the number of unsatisfied checks that occur for a given codeword. A count output equals zero circuit 131 indicates whether unsatisfied check count value 128 is equal to zero. Where unsatisfied check count value 128 is determined to be equal to zero, count output equals zero circuit 131 asserts a zero count output 133. Where zero count output 133 is asserted indicating that unsatisfied check count value 128 is zero, an output codeword generator circuit 134 provides decoder output 167 as output codeword 172.

In addition, a count output less than M circuit 129 determines whether unsatisfied check count value 128 is greater than zero and less than a value M. In some cases, M is ten. Based upon the disclosure provided herein, one of ordinary skill in the art will recognize other values of M that may be used in relation to different embodiments of the present invention. Where count output less than M circuit 129 determines that the value of unsatisfied check count value 128 is greater than zero and less than M, count output less than M circuit 129 asserts an M count output 132.

A local iteration counter circuit 118 receives codeword complete output 117 and counts the number of local iterations that have been applied to the particular codeword (received as decoder output 167). The number of local iterations is provided as a local iteration count value 119. A count output greater than N circuit receives local iteration count value 119 and asserts a count value greater than N output 126 whenever local iteration count value 119 is greater than N. In some cases, N is three. Based upon the disclosure provided herein, one of ordinary skill in the art will recognize other values of N that may be used in relation to different embodiments of the present invention. A count output equals maximum local iterations circuit 121 receives local iteration count value 119 and asserts a count value equals maximum local iterations output 122 whenever local iteration count value 119 equals the defined maximum number of local iterations. is greater than N. In some cases, N is three. Based upon the disclosure provided herein, one of ordinary skill in the art will recognize other values of N that may be used in relation to different embodiments of the present invention. Where M count output 132 indicates that the number of unsatisfied checks is not zero and count value equals maximum local iterations output 122 indicates the maximum number of local iterations have been performed, a decoded output generator circuit 123 provides a derivative of decoder output 167 as decoded output 154.

An index buffer 108 receives index values 107 from unsatisfied check index register 106 and stores them upon completion of a codeword (e.g., codeword complete output 117 is asserted). Index values 109 from index buffer 108 are compared with index values 107 by a same indexes circuit 111 to determine whether there has been a change over the last two local iterations to determine if the same parity check equations remain unsatisfied. Where the same parity check equations remain unsatisfied, same indexes circuit 111 asserts an unchanged output 112. In addition, index values 107 are provided as an index output 176. LLR subset output generator circuit 104 provides LLR subset register output 103 as LLR subset output 177 whenever same indexes output 112 is asserted, count value greater than N output 126 is asserted, and M count output 132 are all asserted.

Figure 2:
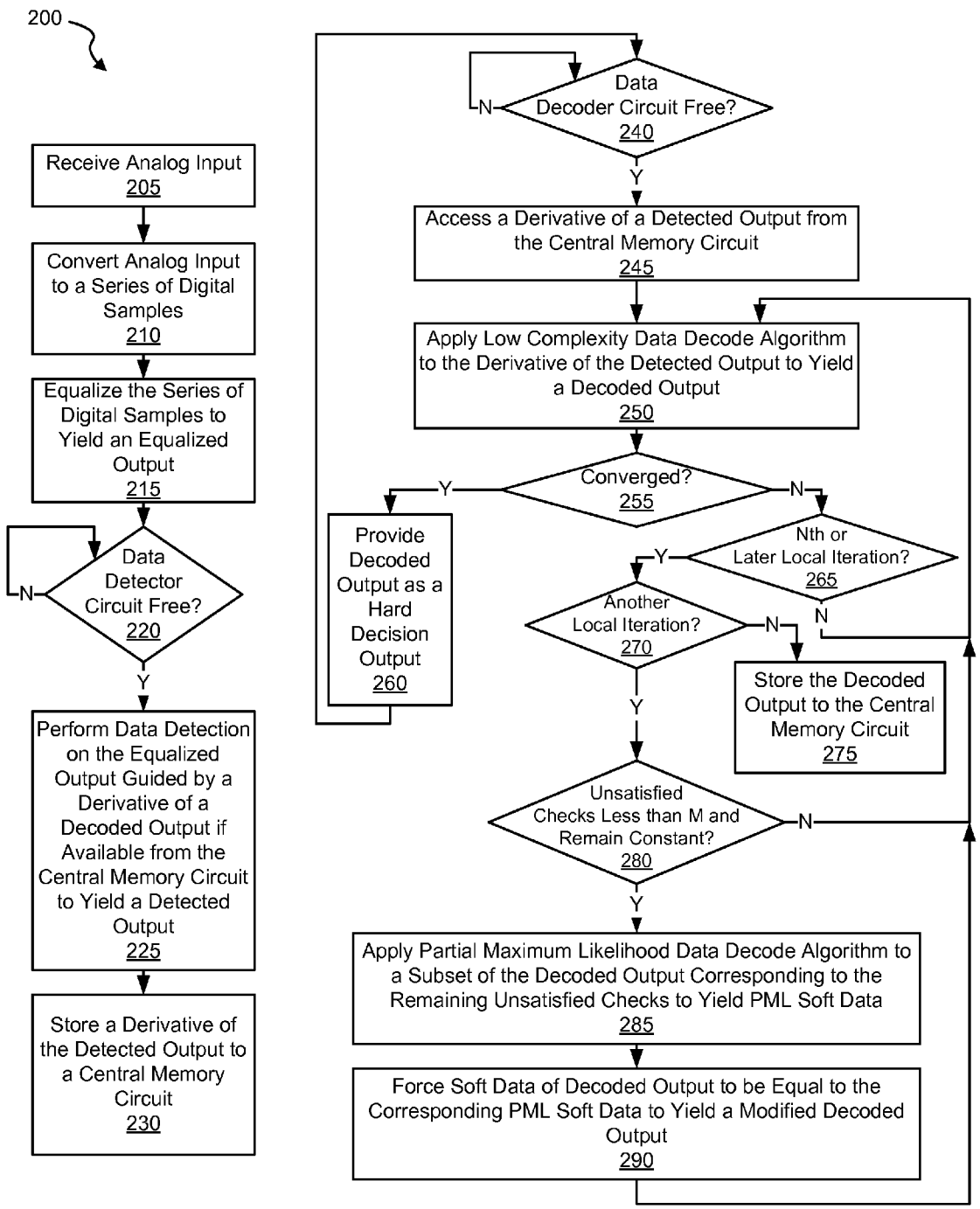
FIG. 2 is a flow diagram showing method for selectively combined data decoding in accordance with various embodiments of the present invention.

Turning to FIG. 2, a flow diagram 200 shows a method for selectively combined data decoding in accordance with various embodiments of the present invention. Following flow diagram 200, an analog input is received (block 205). The analog input may be derived from, for example, a storage medium or a data transmission channel. Based upon the disclosure provided herein, one of ordinary skill in the art will recognize a variety of sources of the analog input. The analog input is converted to a series of digital samples (block 210). This conversion may be done using an analog to digital converter circuit or system as are known in the art. Of note, any circuit known in the art that is capable of converting an analog signal into a series of digital values representing the received analog signal may be used. The resulting digital samples are equalized to yield an equalized output (block 215). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention.

It is determined whether a data detector circuit is available (block 220). Where a data detector circuit is available (block 220), a data detection algorithm is applied to the equalized output guided by a data set derived from a decoded output where available (e.g., the second and later iterations through the data detector circuit and the data decoder circuit) from a central memory circuit to yield a detected output (block 225). In some embodiments of the present invention, data detection algorithm is a Viterbi algorithm as are known in the art. In other embodiments of the present invention, the data detection algorithm is a maximum a posteriori data detector circuit as are known in the art. The data set derived from the decoded output maybe a de-interleaved version of the decoded data set. A signal derived from the detected output (e.g., a locally interleaved version of the detected output) is stored to the central memory to await processing by a data decoder circuit (block 230).

In parallel to the previously discussed data detection processing, it is determined whether a data decoder circuit is available (block 240). Where the data decoder circuit is available (block 240), a previously stored derivative of a detected output is accessed from the central memory (block 245). A low complexity data decode algorithm is applied to the derivative of the detected output to yield a decoded output (block 250). The low complexity decode algorithm maybe be any data decode algorithm known in the art that is less complex to implement than a maximum likelihood decoder algorithm. In some embodiments of the present invention, the low complexity data decode algorithm is a belief propagation data decode algorithm as are known in the art. Such a belief propagation data decode algorithm may be implemented similar to that discussed in Pearl, Judea, "REVEREND BAYES ON INFERENCE ENGINES: A DISTRIBUTED HIERARCHAL APPROACH", AAAI-82 Proceedings, 1982.

It is determined whether the decoded output converged (i.e., the original data set is recovered) (block 255). In some cases, such convergence is found where all of the checksum equations utilized as part of the low complexity decode algorithm are correct. Where the decode algorithm converged (block 255), the decoded output is provided as a hard decision output (block 260). Otherwise, where the decode algorithm failed to converge (block 255), it is determined whether the number of local iterations of the data decode algorithm on the current data set is exceeded a threshold value N (block 265). In some cases, N is four. Based upon the disclosure provided herein, one of ordinary skill in the art will recognize other values of N that may be used in relation to different embodiments of the present invention. Where the number of local iterations has not exceeded the threshold value N (block 265), the processes of blocks 250-265 are repeated for the same data set using the previous decoded output as a guide.

Otherwise, where the number of local iterations has exceeded the threshold value N (block 265), it is determined whether another local iteration is to be performed (block 270). In some cases, this is determined by comparing the number of local iterations that have been completed to a defined threshold number. Where another local iteration is not called for (e.g., the number of local iterations equals a maximum number of local iterations) (block 270), the decoded output is stored to the central memory circuit where it awaits processing by the data detector circuit (i.e., another global iteration) (block 275). Otherwise, where it is determined that another local iteration is called for (e.g., the number of local iterations is not equal to a maximum number of local iterations) (block 270), it is determined whether the number of remaining unsatisfied checks is less than a threshold value M (block 280). In some cases, M is ten. Based upon the disclosure provided herein, one of ordinary skill in the art will recognize other values of M that may be used in relation to different embodiments of the present invention. Where the number of unsatisfied checks is not less than the threshold value M (block 280), the processes of blocks 250-280 are repeated for the same data set using the previous decoded output as a guide.

Otherwise, where the number of unsatisfied checks is less than the threshold value M (block 280), a partial maximum likelihood data decode algorithm is applied to a subset of the decoded output corresponding to the remaining unsatisfied checks to yield a partial maximum likelihood soft data output (block 285). As the partial maximum likelihood data decode algorithm is only applied to a subset of the decoded output localized to the remaining unsatisfied checks, the complexity of the complexity of the partial maximum likelihood data decode algorithm is substantially less than the complexity of a corresponding maximum likelihood decoder circuit capable of handing an entire codeword. In some cases, the partial maximum likelihood data decode algorithm is implemented using the maximum likelihood decoder approach disclosed in Viterbi, Andrew J., "ERROR BOUNDS FOR CONVOLUTION CODES AND AN ASYMPTITICALLY OPTIMUM DECODING ALGORITHM", IEEE Transactions on Information Theory, Vol. IT-13, No. 2, April 1967. The soft data of the decoded output is forced to be equal to the corresponding partial maximum likelihood soft data to yield a modified decoded output (block 290), and the processes of blocks 250-290 are repeated for the same data set using the modified decoded output as a guide.

Figure 3:
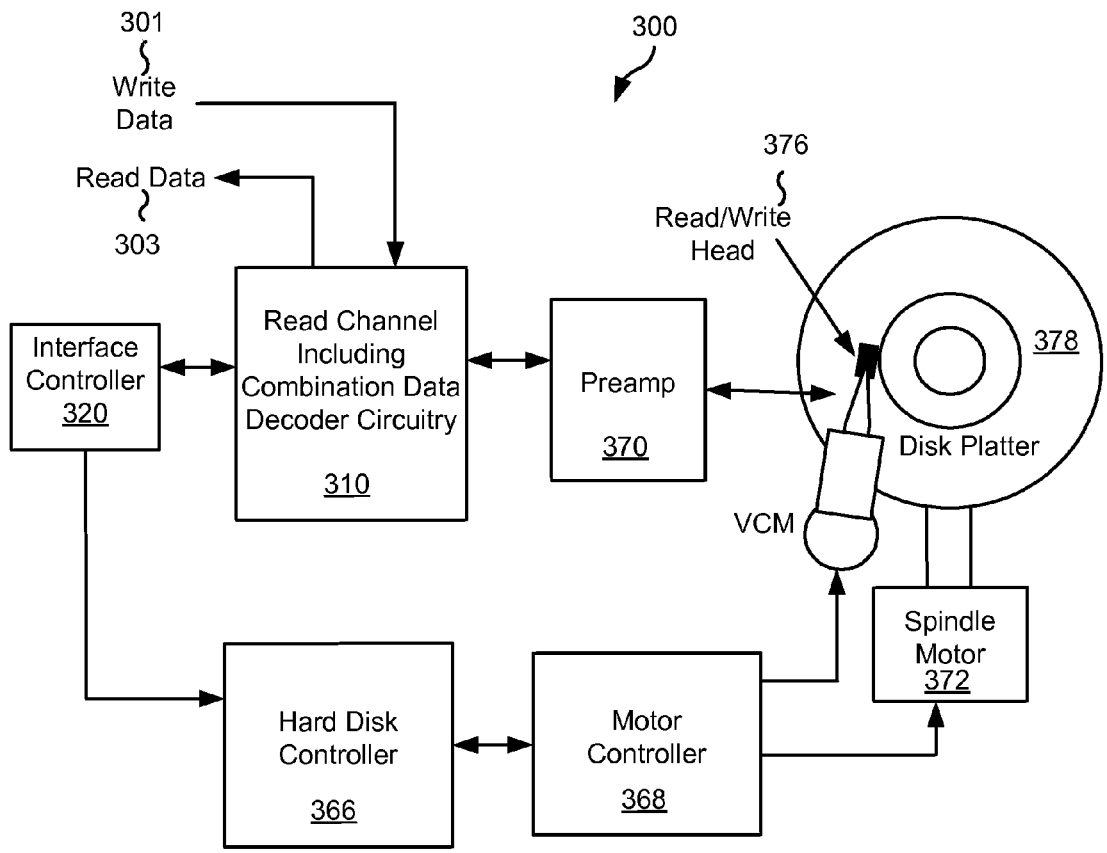
FIG. 3 shows a storage device including combination data decoder circuitry in accordance with one or more embodiments of the present invention.

Turning to FIG. 3, a storage device 300 including combination data decoder circuitry in accordance with one or more embodiments of the present invention. Storage device 300 may be, for example, a hard disk drive. Storage device 300 also includes a preamplifier 370, an interface controller 320, a hard disk controller 366, a motor controller 368, a spindle motor 372, a disk platter 378, and a read/write head assembly 376. Interface controller 320 controls addressing and timing of data to/from disk platter 378. The data on disk platter 378 consists of groups of magnetic signals that may be detected by read/write head assembly 376 when the assembly is properly positioned over disk platter 378. In one embodiment, disk platter 378 includes magnetic signals recorded in accordance with either a longitudinal or a perpendicular recording scheme.

In a typical read operation, read/write head assembly 376 is accurately positioned by motor controller 368 over a desired data track on disk platter 378. Motor controller 368 both positions read/write head assembly 376 in relation to disk platter 378 and drives spindle motor 372 by moving read/write head assembly to the proper data track on disk platter 378 under the direction of hard disk controller 366. Spindle motor 372 spins disk platter 378 at a determined spin rate (RPMs). Once read/write head assembly 378 is positioned adjacent the proper data track, magnetic signals representing data on disk platter 378 are sensed by read/write head assembly 376 as disk platter 378 is rotated by spindle motor 372. The sensed magnetic signals are provided as a continuous, minute analog signal representative of the magnetic data on disk platter 378. This minute analog signal is transferred from read/write head assembly 376 to read channel circuit 310 via preamplifier 370. Preamplifier 370 is operable to amplify the minute analog signals accessed from disk platter 378. In turn, read channel circuit 310 decodes and digitizes the received analog signal to recreate the information originally written to disk platter 378. This data is provided as read data 303 to a receiving circuit. A write operation is substantially the opposite of the preceding read operation with write data 301 being provided to read channel circuit 310. This data is then encoded and written to disk platter 378.

During operation, data decoding applied to the information received from disk platter 378 may not converge. Where it is determined that there is a possible trapping set or other impediment to convergence, a second data decoder and/or decoding algorithm may be applied to a localized portion of the information to correct one or more errors associated with the possible trapping set or other impediment to convergence. Such multi-level decoding may be performed using a data decoder circuit similar to that discussed above in relation to FIGS. 1*a*-1*b*, and/or may be done using a process similar to that discussed above in relation to FIG. 2.

It should be noted that storage system may utilize SATA, SAS or other storage technologies known in the art. Also, it should be noted that storage system 300 may be integrated into a larger storage system such as, for example, a RAID (redundant array of inexpensive disks or redundant array of independent disks) based storage system. It should also be noted that various functions or blocks of storage system 400 may be implemented in either software or firmware, while other functions or blocks are implemented in hardware.

Figure 4:
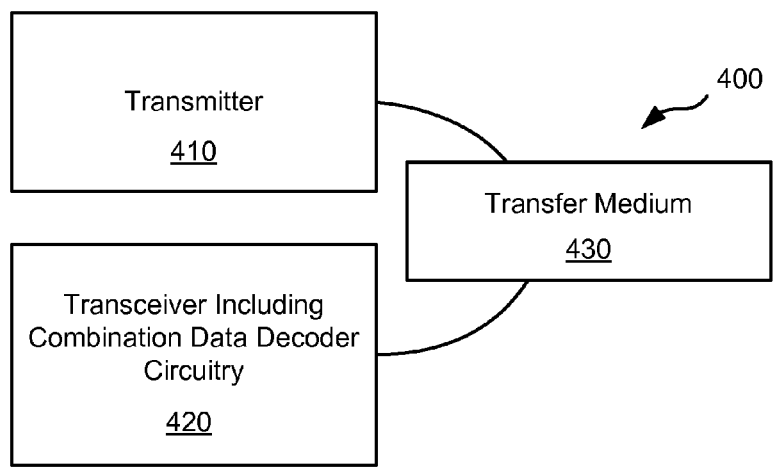
FIG. 4 shows a data transmission system including combination data decoder circuitry in accordance with various embodiments of the present invention.

Turning to FIG. 4, a data transmission system 400 including combination data decoder circuitry in accordance with various embodiments of the present invention. Data transmission system 400 includes a transmitter 410 that is operable to transmit encoded information via a transfer medium 430 as is known in the art. The encoded data is received from transfer medium 430 by receiver 420. Transceiver 420 incorporates combination data decoder circuitry. While processing received data, received data is converted from an analog signal to a series of corresponding digital samples, and the digital samples are equalized to yield an equalized output. The equalized output is then provided to a data processing circuit including both a data detector circuit and a data decoder circuit. Data is passed between the data decoder and data detector circuit via a central memory allowing for variation between the number of processing iterations that are applied to different data sets. It should be noted that transfer medium 430 may be any transfer medium known in the art including, but not limited to, a wireless medium, an optical medium, or a wired medium. Based upon the disclosure provided herein, one of ordinary skill in the art will recognize a variety of transfer mediums that may be used in relation to different embodiments of the present invention.

During operation, data decoding applied to the information received via transfer medium 430 may not converge. Where it is determined that there is a possible trapping set or other impediment to convergence, a second data decoder and/or decoding algorithm may be applied to a localized portion of the information to correct one or more errors associated with the possible trapping set or other impediment to convergence. Such multi-level decoding may be performed using a data decoder circuit similar to that discussed above in relation to FIGS. 1*a*-1*b*, and/or may be done using a process similar to that discussed above in relation to FIG. 2.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
a combination data decoder circuit including:
a first decoder circuit operable to apply a first data decode algorithm to a decoder input to yield a decoded output;
a second decoder circuit operable to apply a second data decode algorithm to a subset of the decoded output to modify at least one element of the decoded output to yield a modified decoded output.

2. The data processing system of claim 1, wherein the decoded output is a first decoded output, and wherein the first decoder circuit is operable to apply the first data decode algorithm to the decoder input guided by the modified decoded output to yield a second decoded output.

3. The data processing system of claim 1, wherein the data processing system further comprises:
a data detector circuit operable to apply a data detection algorithm to a data set to yield a detected output, wherein the decoder input is derived from the detected output.

4. The data processing system of claim 3, wherein the data detection algorithm is selected from a group consisting of: a maximum a posteriori data detection algorithm and a Viterbi detection algorithm.

5. The data processing system of claim 1, wherein the first data decode algorithm is a belief propagation data decode algorithm.

6. The data processing system of claim 5, wherein the second data decode algorithm is a maximum likelihood data decode algorithm.

7. The data processing system of claim 1, wherein the combination data decoder circuit further comprises:
a controller circuit operable to selectively control generation of the modified decoded output.

8. The data processing system of claim 1, wherein the controller circuit enables generation of the modified decoded output when:
a number of iterations of the first decoder circuit applying the first data decode algorithm to a decoder input is greater than a first threshold value;
a number of unsatisfied checks corresponding to the decoded output is less than a second threshold value; and
the unsatisfied checks corresponding to the decoded output is the same as the unsatisfied checks corresponding to a previous decoded output.

9. The data processing system of claim 8, wherein the first threshold value is three, and the second threshold value is ten.

10. The data processing circuit of claim 1, wherein the data processing system is implemented as part of a device selected from a group consisting of: a storage device, and a receiving device.

11. The data processing system of claim 1, wherein the data processing system is implemented as part of an integrated circuit.

12. A method for data processing, the method comprising:
applying a first data decode algorithm to a decoder input to yield a first decoded output;
applying a second data decode algorithm to a subset of the first decoded output to modify at least one element of the decoded output to yield a modified decoded output; and
applying the first data decode algorithm to the decoder input guided by the modified decoded output to yield a second decoded output.

13. The method of claim 12, wherein the method further comprises:
applying a data detection algorithm to a data set to yield a detected output, wherein the decoder input is derived from the detected output.

14. The method of claim 13, wherein the method further comprises:
receiving an analog input;
converting the analog input to a series of digital samples; and
equalizing the series of digital samples to yield the data set.

15. The method of claim 13, wherein the data detection algorithm is selected from a group consisting of: a maximum a posteriori data detection algorithm and a Viterbi detection algorithm.

16. The method of claim 12, wherein the first data decode algorithm is a belief propagation data decode algorithm.

17. The method of claim 16, wherein the second data decode algorithm is a maximum likelihood data decode algorithm.

18. The method of claim 12, wherein the method further comprises:
determining that there are at least one failed checksum associated with the first decoded output; and
wherein the subset of the first decoded output includes elements of the first decoded output that correspond to the at least one failed checksum.

19. The method of claim 18, wherein the method further comprises:
determining that the same at least one failed checksum occurs for at least two consecutive applications of the first data decode algorithm to the decoder input.

20. A storage device, the storage device comprising:
a storage medium;
a head assembly disposed in relation to the storage medium and operable to provide a sensed signal corresponding to information on the storage medium;
a read channel circuit including:
an analog to digital converter circuit operable to sample an analog signal derived from the sensed signal to yield a series of digital samples;
an equalizer circuit operable to equalize the digital samples to yield a data set;
a data detector circuit operable to apply a data detection algorithm to the data set to yield a detected output; and
a combination data decoder circuit including:
a first decoder circuit operable to apply a first data decode algorithm to a decoder input to yield a decoded output, wherein the decoder input is derived from the detected output; and
a second decoder circuit operable to apply a second data decode algorithm to a subset of the decoded output to modify at least one element of the decoded output to yield a modified decoded output.

* * * * *